United States Patent
Hermann

(10) Patent No.: US 10,310,382 B2
(45) Date of Patent: Jun. 4, 2019

(54) MIRROR, IN PARTICULAR FOR A MICROLITHOGRAPHIC PROJECTION EXPOSURE APPARATUS

(71) Applicant: Carl Zeiss SMT GmbH, Oberkochen (DE)

(72) Inventor: Martin Hermann, Heidenheim (DE)

(73) Assignee: CARL ZEISS SMT GMBH, Oberkochen (DE)

(*) Notice: Subject to any disclaimer, the term of this patent is extended or adjusted under 35 U.S.C. 154(b) by 380 days.

(21) Appl. No.: 15/018,316

(22) Filed: Feb. 8, 2016

(65) Prior Publication Data
US 2016/0154317 A1    Jun. 2, 2016

Related U.S. Application Data

(63) Continuation of application No. PCT/EP2014/063349, filed on Jun. 25, 2014.

(30) Foreign Application Priority Data

Aug. 7, 2013   (DE) .................. 10 2013 215 541

(51) Int. Cl.
  *G02B 5/08*   (2006.01)
  *G02B 5/20*   (2006.01)
  (Continued)

(52) U.S. Cl.
  CPC ........... *G03F 7/702* (2013.01); *G02B 5/0816* (2013.01); *G02B 5/0891* (2013.01);
  (Continued)

(58) Field of Classification Search
  CPC ...... G02B 5/0891; G02B 5/26; G02B 5/0816; G02B 5/0875; G02B 5/08; G02B 5/0858; G02B 5/085
  (Continued)

(56) References Cited

U.S. PATENT DOCUMENTS

| 4,870,648 A | 9/1989 | Ceglio et al. |
| 6,377,655 B1 | 4/2002 | Murakami et al. |

(Continued)

FOREIGN PATENT DOCUMENTS

| CN | 1900745 B | 2/2011 |
| CN | 102736441 A | 10/2012 |

(Continued)

OTHER PUBLICATIONS

Office Action in corresponding Chinese Application CN201480049179.8, dated Aug. 9, 2017, along with English Translation.
(Continued)

*Primary Examiner* — Mahidere S Sahle
(74) *Attorney, Agent, or Firm* — Edell, Shapiro & Finnan, LLC

(57) ABSTRACT

A mirror (10, 20, 30, 40), more particularly for a microlithographic projection exposure apparatus, has an optical effective surface (10a, 20a, 30a, 40a), a mirror substrate (11, 21, 31, 41) and a reflection layer stack (14, 24, 34, 44) for reflecting electromagnetic radiation impinging on the optical effective surface (10a, 20a, 30a, 40a), wherein a layer (13, 23, 33, 43) composed of a group III nitride is arranged between the mirror substrate (11, 21, 31, 41) and the reflection layer stack (14, 24, 34, 44), wherein the group III nitride is selected from the group containing gallium nitride (GaN), aluminum nitride (AlN) and aluminum gallium nitride (AlGaN).

20 Claims, 3 Drawing Sheets

(51) Int. Cl.
*F21V 9/04* (2018.01)
*F21V 9/06* (2018.01)
*G03F 7/20* (2006.01)
*G21K 1/06* (2006.01)

(52) U.S. Cl.
CPC ...... *G03F 7/70316* (2013.01); *G03F 7/70958* (2013.01); *G21K 1/062* (2013.01)

(58) Field of Classification Search
USPC .................................................. 359/359, 360
See application file for complete search history.

(56) References Cited

U.S. PATENT DOCUMENTS

| | | | |
|---|---|---|---|
| 6,710,351 B2 | 3/2004 | Berger | |
| 8,124,302 B2* | 2/2012 | Ono | B82Y 10/00 427/140 |
| 2005/0199830 A1 | 9/2005 | Bowering et al. | |
| 2008/0043321 A1* | 2/2008 | Bowering | G02B 5/0891 359/359 |
| 2010/0195075 A1* | 8/2010 | Chan | B82Y 10/00 355/67 |
| 2011/0117479 A1 | 5/2011 | Suga et al. | |
| 2012/0044473 A1 | 2/2012 | Lippert et al. | |
| 2012/0320354 A1 | 12/2012 | Yakunin | |
| 2013/0057952 A1 | 3/2013 | Risse et al. | |
| 2013/0170056 A1 | 7/2013 | Ekstein et al. | |
| 2013/0301151 A1 | 11/2013 | Ekstein et al. | |
| 2014/0240821 A1* | 8/2014 | Ballou | G02B 5/0858 359/360 |
| 2014/0285783 A1 | 9/2014 | Dinger et al. | |
| 2017/0227689 A1* | 8/2017 | Ballou | G02B 5/0858 |

FOREIGN PATENT DOCUMENTS

| | | | |
|---|---|---|---|
| DE | 102004002757 A1 | 8/2005 | |
| EP | 1365263 A1 | 11/2003 | |
| JP | H11326598 A | 11/1991 | |
| JP | H04164291 A | 6/1992 | |
| JP | H06109907 A | 4/1994 | |
| JP | 06308294 A * | 11/1994 | G03F 7/702 |
| JP | 06308294 A | 11/1994 | |
| JP | H0868897 A | 3/1996 | |
| JP | H1073705 A | 3/1998 | |
| JP | 2004177587 A | 6/2004 | |
| JP | 2005234344 A | 9/2005 | |
| JP | 2007528608 A | 10/2007 | |
| JP | 2011108942 A | 6/2011 | |
| JP | 2012069925 A | 4/2012 | |
| JP | 2013504095 A | 2/2013 | |
| JP | 2013541193 A | 11/2013 | |
| JP | 2014506724 A | 3/2014 | |
| JP | 2014514742 A | 6/2014 | |
| WO | 2005091887 A2 | 10/2005 | |
| WO | 2012113591 A1 | 8/2012 | |
| WO | 2012126954 A1 | 9/2012 | |

OTHER PUBLICATIONS

International Search Report in counterpart International Application No. PCT/EP2014/063349, dated Jan. 30, 2015.
Bittar, A. et al., "Ion-assisted deposition . . . ", Applied Physics Letters, American Institute of Physics, vol. 78, No. 5, Jan. 2001,pp. 619-621.
Ionascut-Nedelcescu, A. et al., "Radiation Harness of Gallium Nitride", IEEE Transactions on Nuclear Science, New York, vol. 49, No. 6, Dec. 2002.
Lanke, U. et al., "Effect of ion-energy on the properties of amorphous . . . ", Modern Physics Letters B, Singapore, vol. 15, No. 28-29, Dec. 2001, pp. 1355-1360.
Sellin, P.J. et al., "New materials for radiation hard semiconductor dectectors", Nuclear Instruments and Methods in Physics Research. Section A: Accelerators, Spectrometers, Detectors, and Associated Equipment, vol. 557, No. 2, Feb. 2006, pp. 479-489.
Office Action in corresponding German Application No. 10 2013 215 541.7, dated Feb. 13, 2014, along with an English translation.
International Preliminary Report on Patentability in counterpart International Application No. PCT/EP20141063349, dated Feb. 9, 2016.
Xueping Xu et al.: "Fabrication of GaN wafers for electronic and optoelectronic devices", Optical Materials 23 (2003), pp. 1-5.
Trodahl H. J. et al: "Raman spectroscopy of nanocrystalline and amorphous GaN", Journal of Applied Physics 97, (2005), pp. 084309-1 to 084309-5.
Kennedy V.J. et al.: "Ion beam analysis of ion-assisted deposited amorphous GaN", Nuclear Instruments and Methods in Physics Research B 190 (2002), pp. 620-624.
Ruck B. J. et al: "Quantitative study of molecular N2 trapped in disordered GaN:O films", Physical Review B 70 (2004), pp. 235202-1 to 235202-5.
Koo et al.: "Structural and Optoelectronic Properties of Amorphous GaN", ICPS 03.
McCluskey M. D. et al.: "Phase separation in InGaN/GaN multiple quantum wells", Applied Physics Letters, vol. 72, No. 14, Apr. 6, 1998, pp. 1730-1732.
Office Action in corresponding Chinese Application 201480049179.8, dated Dec. 23, 2016, along with English Translation.
Office Action in corresponding Chinese Application 201480049179.8, dated Feb. 7, 2018, along with English Translation.
Office Action in corresponding Japanese Application 2016532276, dated Apr. 20, 2018, along with English Translation.

* cited by examiner

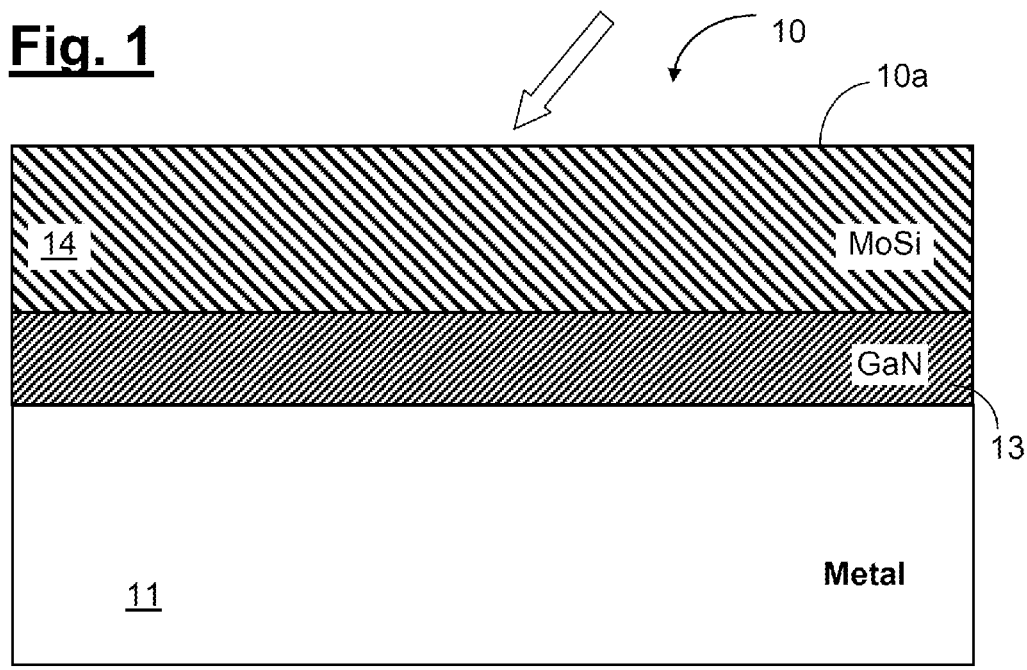
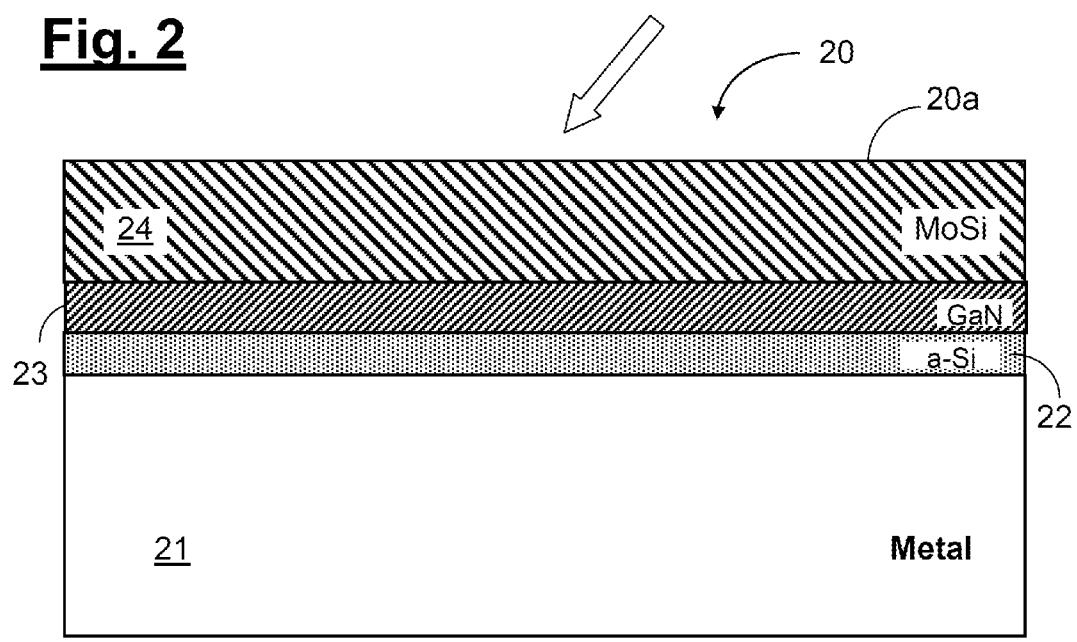

MIRROR, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2014/063349, which has an international filing date of Jun. 25, 2014, and the disclosure of which is incorporated in its entirety into the present Continuation by reference. The following disclosure is also based on and claims the benefit of and priority under 35 U.S.C. § 119(a) to German Patent Application No. DE 10 2013 215 541.7, filed Aug. 7, 2013, which is also incorporated in its entirety into the present Continuation by reference.

FIELD OF THE INVENTION

The invention relates to a mirror, in particular for a microlithographic projection exposure apparatus.

BACKGROUND

Microlithography is used for producing microstructured components, such as for example integrated circuits or LCDs. The microlithography process is carried out in a so-called projection exposure apparatus having an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process. Such EUV mirrors have a mirror substrate and a reflection layer stack—constructed from a multiplicity of layer packets—for reflecting the electromagnetic radiation impinging on the optical effective surface. As mirror substrate material—for instance in the illumination device—metallic materials such as e.g. copper or aluminum or else—for instance in the projection lens—amorphous mirror substrate materials such as titanium dioxide ($TiO_2$)-doped quartz glass (as sold under the trademarks ULE or Zerodur, for instance) are known.

Since adequate polishing of diverse (in particular metallic) mirror substrate materials cannot readily be achieved in terms of production engineering during the production of the mirror, in general use is made of additional polishing layers, e.g. composed of amorphous silicon (=a-Si), which can be processed with higher precision. However, here in practice the problem occurs, inter alia, that such polishing layers and possibly also the mirror substrate material itself, on account of the radiation loading resulting from the impinging EUV light, exhibit structural alterations, e.g. on account of compaction effects, which in turn affect the geometry of the applied reflection layer stack and thus the reflection properties of the mirror.

A further problem that occurs on account of the radiation loading resulting from EUV light during the operation of the projection exposure apparatus results from radiation-governed aging effects of the mirror substrate material itself, particularly if the amorphous mirror substrate materials mentioned above are used e.g. in the projection lens. In order to protect such mirror substrate materials and possibly also the polishing layers mentioned above, inter alia the use of protection layers (for short: SPL="Substrate Protection Layer") has proved to be expedient, which can be produced from a material that absorbs the EUV light to a comparatively great extent.

With regard to the prior art, merely by way of example, reference is made to the publications A. Ionascut-Nedelcescu et al.: "*Radiation Hardness of Gallium Nitride*", IEEE Transactions on Nuclear Science Vol. 49 (2002), pages 2733-2738; Xueping Xu et al.: "*Fabrication of GaN wafers for electronic and optoelectronic devices*", Optical Materials 23 (2003), pages 1-5 and P. J. Sellin et al.: "*New materials for radiation hard semiconductor detectors*", CERN-OPEN-2005-005, pages 1-24.

SUMMARY

It is an object of the present invention to provide a mirror, in particular for a microlithographic projection exposure apparatus, in which undesired radiation-induced structural alterations of the layer construction and thus undesired impairments of the reflection properties are avoided particularly effectively.

This object is achieved according to one formulation of the invention with a mirror in particular for a microlithographic projection exposure apparatus, which has an optical effective surface, and includes a mirror substrate, a reflection layer stack for reflecting electromagnetic radiation impinging on the optical effective surface, and a layer composed of a group III nitride arranged between the mirror substrate and the reflection layer stack, wherein the group III nitride is selected from the group containing gallium nitride (GaN), aluminum nitride (AlN) and/or aluminum gallium nitride (AlGaN).

A concept associated with the invention is, in particular, that of inserting, in the layer construction of a mirror of a microlithographic projection exposure apparatus designed for operation in the EUV, between the mirror substrate and the reflection layer stack, an amorphous layer composed of a group III nitride (i.e. a nitride comprising one or a plurality of elements of the third main group in the periodic system), such as e.g. gallium nitride (GaN) or aluminum nitride (AlN).

In this regard, it is to be noted, inter alia, that a material such as gallium nitride, on account of the comparatively high binding energy or the (for example relative to amorphous silicon) high energetic barrier with respect to the displacement of an atom from its lattice position ("Atomic Displacement Energy"), is relatively insensitive to electromagnetic irradiation and thus has a correspondingly high radiation resistance. This, in turn can be advantageously utilized to provide an EUV mirror with a polishing layer and/or a protection layer. In this regard, the binding energy for silicon is approximately 3.6 eV, for amorphous silicon (a-Si) approximately 4 eV to 4.8 eV, for gallium nitride (GaN) approximately 8.9 eV and for aluminum nitride (AlN) approximately 11.5 eV.

At the same time use can be made of the likewise desirable criterium of the smallest possible difference in the coefficient of thermal expansion with respect to the reflection layer stack, on the one hand. With respect to the mirror substrate material, on the other hand, the criterium is satisfied even better for a material such as gallium nitride in comparison with amorphous silicon, for instance, as will be explained in even greater detail below.

Furthermore, in the case of crystalline gallium nitride layers, for example, sufficiently low roughnesses that ensure the functionality of the polishing layer described above can be obtained in the case of gallium nitride, for example, by material removal using various possible polishing agents. In the case where mixed phases composed of crystalline and amorphous material are present, however, the polishability is generally impaired.

In this case, it is consciously accepted that production engineering challenges which arise from the fact that, firstly, the application of the (e.g. gallium nitride) layer according to the invention has to take place at comparatively low temperatures of below approximately 100-200° C. in order to avoid damage particularly to the mirror substrate material (e.g. ULE or Zerodur) and, secondly, the formation of crystallites in the layer material (to which there is a certain tendency in gallium nitride, for instance, even at the relatively low temperatures mentioned above) and an attendant change in polishing properties or rates and adverse effect on the suitability as polishing layer should be avoided.

It has been discovered, in particular, that the abovementioned production engineering challenges can be mastered by the use of suitable methods (in particular nitrogen ion assisted (gallium) vapor deposition with provision of a surplus of nitrogen during coating and a comparatively high nitrogen ion energy for obtaining an amorphous material).

On account of the above-described advantageous properties of the gallium nitride layer, this layer can perform a dual function, in particular, insofar as it serves firstly as a polishing layer and secondly as a protection layer or absorber layer for protecting a mirror substrate e.g. composed of ULE or Zerodur or a metallic mirror substrate material situated underneath in the layer construction. In this case, e.g. a further polishing layer composed, for instance, of amorphous silicon can be dispensed with.

However, the invention is not restricted to the use of the dual function described above. In this regard, in further embodiments, the (e.g. gallium nitride) layer according to the invention can also be applied, in addition to an existing polishing layer (for instance composed of amorphous silicon) on said polishing layer in order, making use of the effect as an absorber layer, to ensure protection both of the polishing layer and of the mirror substrate material situated underneath against radiation-induced effects and structural changes owing to the EUV light.

In accordance with one embodiment, the group III nitride is amorphous.

The group III nitride can be, in particular, a binary or a ternary compound.

In accordance with one embodiment, the layer has a thickness in the range of 0.1 µm to 100 µm, in particular in the range of 0.5 µm to 50 µm.

In accordance with one embodiment, the layer is arranged directly on the mirror substrate or on an (e.g. nitrogen-containing) adhesion promoter layer situated on the mirror substrate.

In accordance with one embodiment, the layer is arranged on a polishing layer.

In accordance with one embodiment, the mirror substrate is produced from a metallic material (e.g. copper (Cu) or aluminum (Al)).

In accordance with one embodiment, the mirror substrate is produced from an amorphous material, in particular titanium dioxide ($TiO_2$)-doped quartz glass.

The mirror can be designed in particular for an operating wavelength of less than 30 nm, in particular less than 15 nm. However, the invention is not in principle restricted thereto either and, in further embodiments, can also be realized in a mirror designed for operating wavelengths in the VUV range (e.g. less than 200 nm).

The invention furthermore relates to an optical system of a microlithographic projection exposure apparatus, in particular an illumination device or a projection lens, wherein the optical system comprises at least one mirror having the features described above.

In accordance with a further aspect, the invention relates to a method for producing a mirror for a microlithographic projection exposure apparatus, wherein a layer system is applied on a mirror substrate, said layer system having a reflection layer stack for reflecting electromagnetic radiation impinging on the optical effective surface, wherein a layer composed of a group III nitride is applied before the reflection layer stack is applied, wherein the group III nitride is selected from the group containing gallium nitride (GaN), aluminum nitride (AlN) and aluminum gallium nitride (AlGaN).

The layer composed of the group III nitride can be applied by nitrogen ion assisted vapor deposition or by some other suitable method such as e.g. sputtering, subsequent ion implantation, etc.

In accordance with one embodiment, the layer is polished before the reflection layer stack is applied.

In accordance with one embodiment, a surface profile is worked into the layer, said surface profile at least partly compensating for a deformation which is present in the layer system of the mirror and which is induced by mechanical strain.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIG. 1 shows a schematic illustration for elucidating the construction of a mirror comprising a metallic mirror substrate material in accordance with a first embodiment of the invention;

FIG. 2 shows a schematic illustration for elucidating the construction of a mirror comprising a metallic mirror substrate material in accordance with a further embodiment of the invention;

DETAILED DESCRIPTION

Figure 3:
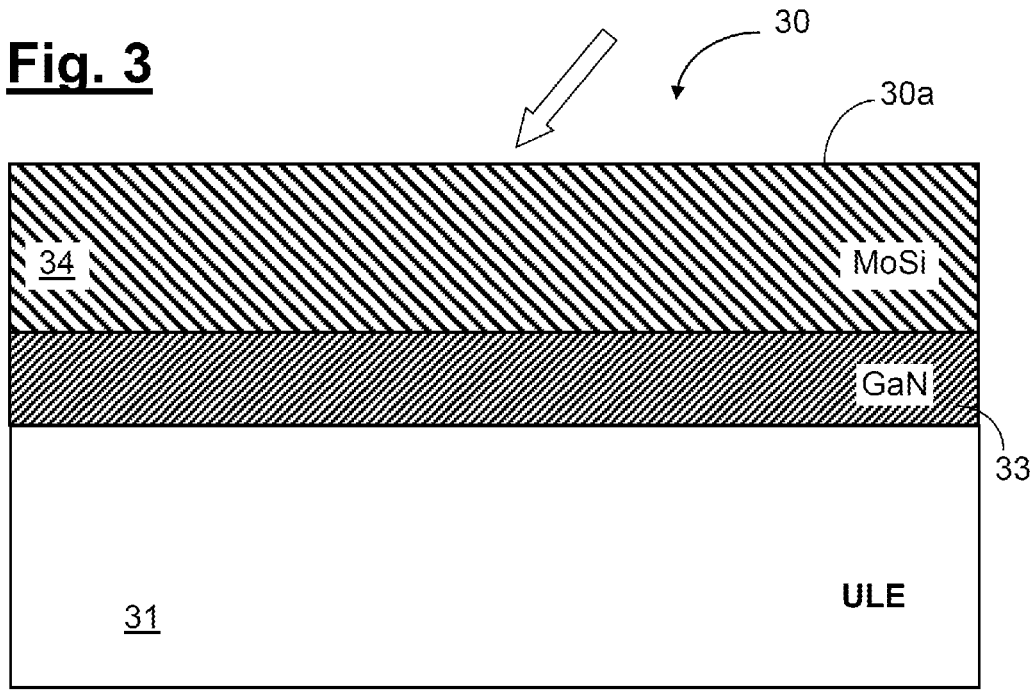
FIGS. 3-4 show schematic illustrations for elucidating the construction of a mirror comprising an amorphous mirror substrate material in accordance with further embodiments of the invention.

FIG. 1 shows a schematic illustration for elucidating the construction of a mirror according to the invention in a first embodiment of the invention. The mirror 10 can be in particular an EUV mirror of an optical system, in particular of the projection lens or of the illumination device of a microlithographic projection exposure apparatus.

The mirror 10 comprises in particular a mirror substrate 11, which, in the first embodiment, is produced from a metallic mirror substrate material, for example copper (Cu) or aluminum (Al).

Furthermore, the mirror 10 comprises, in a manner known per se in principle, a reflection layer system 14, which, in the embodiment illustrated, merely by way of example, comprises a molybdenum-silicon (Mo—Si) layer stack (and, if appropriate, diffusion barrier layers, etc.). Without the invention being restricted to specific configurations of this layer stack, one suitable construction that is merely by way of example can comprise, for instance, 50 plies or layer packets of a layer system comprising molybdenum (Mo) layers having a layer thickness of in each case 2.8 nm and silicon (Si) layers having a layer thickness of in each case 4.2 nm.

In accordance with FIG. 1, a layer 13 composed of amorphous gallium nitride (GaN) is arranged directly on the mirror substrate 11, which layer (without the invention being restricted thereto) can have a typical thickness in the range of 0.1 μm to 100 μm and has a dual function as explained below: The layer 13 composed of gallium nitride (GaN) serves firstly as a polishing layer in order to take account of an inadequate polishability of the metallic mirror substrate 11 situated underneath. A further polishing layer composed, for instance, of amorphous silicon (=a-Si) is thus dispensed with in the construction in FIG. 1. Furthermore, the layer 13 also serves as a protection layer or absorber layer in order to ensure protection of the mirror substrate 11 situated underneath.

Besides the above-described dual function of the layer 13 composed of gallium nitride (GaN) and the resultant simplification of the layer construction, it has the further advantage that for gallium nitride (GaN) the difference in the coefficient of thermal expansion with respect to the reflection layer stack 14, on the one hand, and with respect to the mirror substrate material, on the other hand, is even lower than for amorphous silicon (a-Si).

In this respect, table 1 presents the coefficients of thermal expansion for crystalline gallium nitride (GaN) in comparison with the respective coefficients of thermal expansion for typical materials of the reflection layer stack, on the one hand, and of the mirror substrate material, on the other hand.

TABLE 1

|  | Material | Coefficient of thermal expansion |
| --- | --- | --- |
| Mirror substrate | Copper (Cu) | $16.5 \cdot 10^{-6}$ K$^{-1}$ |
|  | aluminum (Al) | $26.1 \cdot 10^{-6}$ K$^{-1}$ |
| Coating | Mo/Si reflection layer stack | $8 \cdot 10^{-6}$ K$^{-1}$ |
| Polishing layer | a-Si | $(2.6 \ldots 3.5) \cdot 10^{-6}$ K$^{-1}$ |
|  | GaN (crystalline) | $4.1 \cdot 10^{-6}$ K$^{-1}$ |

FIG. 2 shows, in schematic illustration, the construction of a mirror in a further embodiment, wherein components analogous or substantially functionally identical to FIG. 1 are designated by reference numerals higher by "10".

The construction in accordance with FIG. 2 differs from that from FIG. 1 in that a polishing layer 22 composed of amorphous silicon (a-Si) is firstly arranged on the mirror substrate 21 in a manner known per se, in order to take account of an inadequate polishability of the metallic mirror substrate 21 situated underneath. The layer 23 according to the invention composed of gallium nitride (GaN) is situated on said polishing layer 22 and serves to ensure, as absorber layer, projection both of the polishing layer 22 and of the mirror substrate material situated underneath against radiation-induced effects and structural changes owing to the EUV light.

Figure 4:
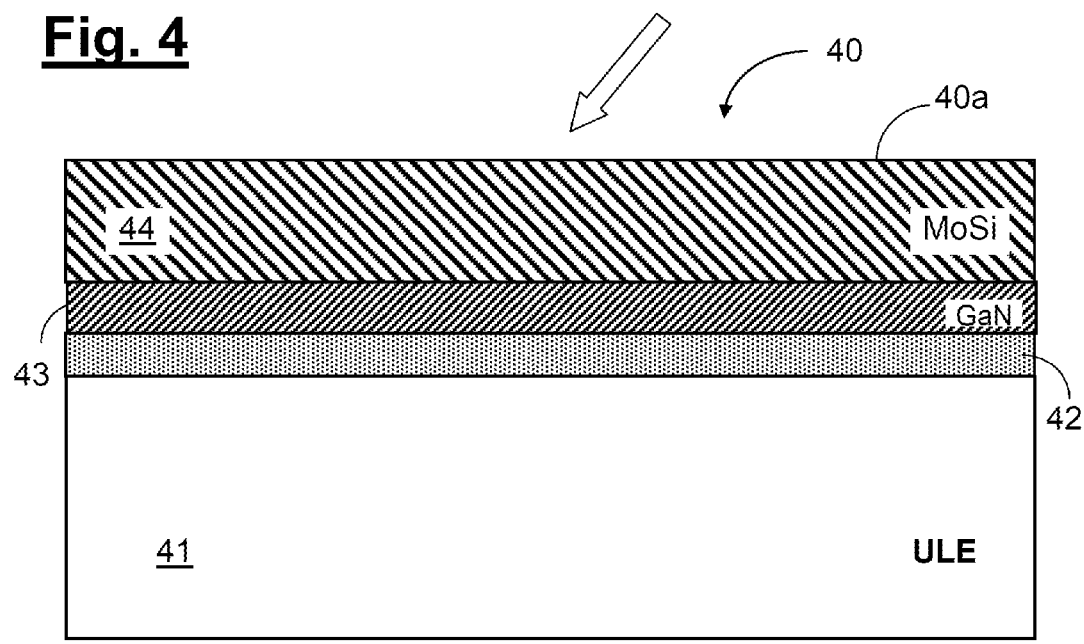

In further embodiments, the mirror substrate material can also be an amorphous material, as is illustrated merely schematically in FIG. 3 and FIG. 4. Suitable mirror substrate materials are e.g. titanium dioxide (TiO$_2$)-doped quartz glass, wherein the materials sold under the trademarks ULE or Zerodur can be used merely by way of example (and without the invention being restricted thereto).

In this case, in FIG. 3, components analogous or substantially functionally identical to FIG. 1 are designated by reference numerals higher by "20". In FIG. 4, components analogous or substantially functionally identical to FIG. 2 are correspondingly designated by reference numerals higher by "20", wherein here an adhesion promoter layer 42 (e.g. composed of titanium nitride, TiN) is firstly arranged on the mirror substrate 41, the layer 43 composed of gallium nitride (GaN) then being situated on said adhesion promoter layer.

In order to produce a mirror according to the invention, the layer 13, 23, 33 or 43 composed of gallium nitride, for example, is applied by nitrogen ion assisted vapor deposition preferably at room temperature. In this case, during coating by way of a suitable "adjustment" of the ratio of nitrogen (N) to gallium (Ga) a surplus of nitrogen in conjunction with a comparatively high nitrogen ion energy of e.g. hundreds of electron volts (eV) can ensure the formation of amorphous material whilst avoiding crystallite formation.

With regard to suitable method parameters for producing an amorphous gallium nitride layer, reference is made for example to Uday Lanke et al.: "*Effect of ion-energy on the properties of amorphous GaN films produced by ion-assisted deposition*", Modern Physics Letters B, Vol. 15, Nos. 28 & 29 (2001), pages 1355-1360; A. Bittar et al.: "*Ion-assisted deposition of amorphous GaN. Raman and optical properties*", Applied Physics Letters, Vol. 78, Number 5, Jan. 29, 2001, pages 619-621; H. J. Trodahl et al.: "*Raman spectroscopy of nanocrystalline and amorphous GaN*", Journal of Applied Physics 97, (2005), pages 084309-1 to 084309-5; V. J. Kennedy et al.: "*Ion beam analysis of ion-assisted deposited amorphous GaN*", Nuclear Instruments and Methods in Physics Research B 190 (2002), pages 620-624; B. J. Ruck et al.: "*Quantitative study of molecular N$_2$ trapped in disordered GaN:O films*", Physical Review B 70 (2004), pages 235202-1 to 235202-5.

In further embodiments, the layer 13, 23, 33 or 43 composed of gallium nitride, for example, can also be applied by some other suitable method such as e.g. sputtering, subsequent ion implantation, etc.

After the application of the layer 13, 23, 33 or 43 composed of gallium nitride, for example, in accordance with the embodiments in FIGS. 1-4, said layer can be polished in order to apply the reflection layer stack with the required exactness. In such a polishing step, a surface profile (e.g. a specific radius of curvature or a freeform surface) can also be worked in a targeted manner into the layer 13, 23, 33 or 43 composed of gallium nitride, for example, in order, for instance, to at least partly compensate for a mechanical strain present in the layer system of the mirror and an attendant undesired deformation of the mirror. If the roughness of the layer 13, 23, 33 or 43 after application is already sufficiently low (e.g. less than 0.1 nm rms) and a targeted surface profile is not desired, such a polishing step can also be dispensed with, if appropriate.

Figure 5:
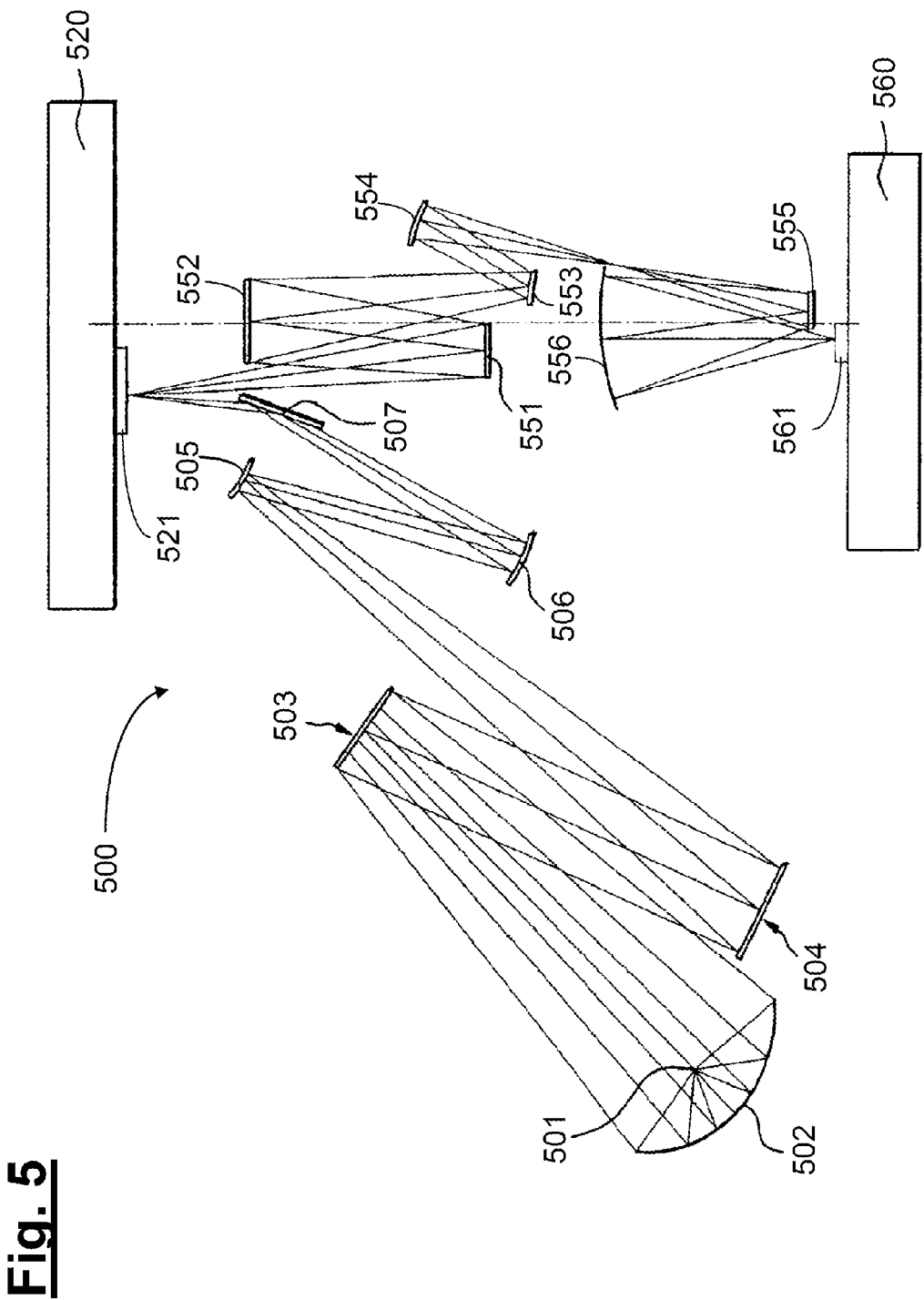
FIG. 5 shows a schematic illustration of an exemplary construction of a microlithographic projection exposure apparatus.

FIG. 5 shows a schematic illustration of one exemplary projection exposure apparatus which is designed for operation in the EUV and in which the present invention can be realized.

In accordance with FIG. 5, an illumination device in a projection exposure apparatus 500 designed for EUV comprises a field facet mirror 503 and a pupil facet mirror 504. The light from a light source unit comprising a plasma light source 501 and a collector mirror 502 is directed onto the field facet mirror 503. A first telescope mirror 505 and a second telescope mirror 506 are arranged in the light path downstream of the pupil facet mirror 504. A deflection mirror 507 is arranged downstream in the light path, said deflection mirror directing the radiation impinging on it onto an object field in the object plane of a projection lens comprising six mirrors 551-556. A reflective structure-bearing mask 521 on a mask stage 520 is arranged at the location of the object field, said mask being imaged into an image plane with the aid of the projection lens, in which image plane is situated a substrate 561 coated with a light-sensitive layer (photoresist) on a wafer stage 560.

The field facet mirror 503, the pupil facet mirror 504 or the deflection mirror 507 can comprise for example a mirror substrate composed of a metallic mirror substrate material such as e.g. copper (Cu) or aluminum (Al) and can be configured with a layer 13 composed of gallium nitride (GaN) for example in accordance with the embodiment from FIG. 1, said layer serving in particular as a polishing layer, in order to enable more precise processing in comparison with the metallic mirror substrate material, and also as a protection layer.

The mirrors 551-556 of the projection lens can comprise for example a mirror substrate composed of an amorphous mirror substrate material such as titanium dioxide ($TiO_2$)-doped quartz glass (e.g. ULE or Zerodur) and can be configured with a layer 33 composed of gallium nitride (GaN) for example as described with reference to FIG. 3, said layer serving both as a polishing layer and as a protection layer or absorber layer for protecting the mirror substrate materials situated underneath.

However, the invention is not restricted to application to the mirrors mentioned above, such that in principle other mirrors can also be configured in the manner according to the invention.

Even though the invention has been described on the basis of specific embodiments, numerous variations and alternative embodiments are evident to the person skilled in the art, e.g. through combination and/or exchange of features of individual embodiments. Accordingly, variations and alternative embodiments will be apparent to the person skilled in the art and are concomitantly encompassed by the present invention. The scope of the invention is restricted only within the meaning of the appended patent claims and equivalents thereof.

What is claimed is:

1. A mirror having an optical effective surface, comprising a mirror substrate;
   a reflection layer stack for reflecting electromagnetic radiation impinging on the optical effective surface; and
   a layer composed of a group III nitride arranged between the mirror substrate and the reflection layer stack, wherein the group III nitride comprises at least one of gallium nitride (GaN), aluminum nitride (AlN) or aluminum gallium nitride (AlGaN);
   wherein the layer has a thickness of at least 0.1 μm and of at most 100 μm;
   wherein said mirror is configured to be arranged in a microlithographic projection exposure apparatus; and
   wherein a surface profile of the layer is configured to at least partly compensate for mechanical strain formed between layers of the reflection layer stack.

2. A mirror having an optical effective surface, comprising a mirror substrate;
   a reflection layer stack for reflecting electromagnetic radiation impinging on the optical effective surface; and
   a layer composed of a group III nitride arranged between the mirror substrate and the reflection layer stack, wherein the group III nitride comprises at least one of gallium nitride (GaN), aluminum nitride (AlN) or aluminum gallium nitride (AlGaN);
   wherein the layer has a thickness of at least 0.1 μm and of at most 100 μm;
   wherein said mirror is configured to be arranged in a microlithographic projection exposure apparatus; and
   wherein the group III nitride is amorphous.

3. The mirror as claimed in claim 1, wherein the layer has a thickness of at least 0.5 μm and of at most 50 μm.

4. The mirror as claimed in claim 1, wherein the layer is arranged directly on the mirror substrate.

5. The mirror as claimed in claim 1, further comprising a polishing layer on which the layer is arranged.

6. The mirror as claimed in claim 1, wherein the mirror substrate is produced from a metallic material.

7. The mirror as claimed in claim 1, wherein the mirror substrate is produced from an amorphous material.

8. The mirror as claimed in claim 1, configured for an operating wavelength of less than 30 nm.

9. An optical system of a microlithographic projection exposure apparatus, comprising at least one mirror as claimed in claim 1.

10. A method for producing a mirror for a microlithographic projection exposure apparatus, comprising:
    applying a layer system on a mirror substrate, said layer system having a reflection layer stack configured to reflect electromagnetic radiation impinging on the optical effective surface,
    applying a layer composed of a group III nitride before the reflection layer stack is applied to the mirror substrate, wherein the group III nitride comprises at least one of gallium nitride (GaN), aluminum nitride (AlN) or aluminum gallium nitride (AlGaN), and wherein the layer has a thickness of at least 0.1 μm and of at most 100 μm, and
    working a surface profile into the layer, wherein the surface profile at least partly compensates for mechanical strain formed between layers of the reflection layer stack.

11. The method as claimed in claim 10, further comprising polishing the layer before the reflection layer stack is applied.

12. The mirror as claimed in claim 1, further comprising an adhesion promoter layer situated on the mirror substrate and on which the layer is arranged.

13. The mirror as claimed in claim 7, wherein the amorphous material is a titanium dioxide ($TiO_2$)-doped quartz glass.

14. The mirror as claimed in claim 8, configured for an operating wavelength of less than 15 nm.

15. The optical system as claimed in claim 9, wherein the microlithographic projection exposure apparatus is an illumination device or a projection lens.

16. The mirror as claimed in claim 5, wherein the polishing layer comprises amorphous silicon.

17. The mirror as claimed in claim 2, wherein a surface profile of the layer is configured to at least partly compensate for mechanical strain formed between layers of the reflection layer stack.

18. The mirror as claimed in claim 1, wherein the group III nitride is amorphous.

19. The mirror as claimed in claim 12, wherein the adhesion promoter layer is comprised of a first material, wherein the substrate is comprised of a second material, and wherein the first material is different from the second material.

20. The mirror as claimed in claim 2, wherein the mirror substrate is produced from a metallic material or from titanium dioxide (TiO2)-doped quartz glass.

* * * * *

UNITED STATES PATENT AND TRADEMARK OFFICE
CERTIFICATE OF CORRECTION

PATENT NO. : 10,310,382 B2
APPLICATION NO. : 15/018316
DATED : June 4, 2019
INVENTOR(S) : Martin Hermann Page 1 of 1

It is certified that error appears in the above-identified patent and that said Letters Patent is hereby corrected as shown below:

On the Title Page

Page 2, Column 1, under "FOREIGN PATENT DOCUMENTS," in Line 4, delete "H04164291 A" and insert -- H04164297 A --, therefor.

Signed and Sealed this
Thirtieth Day of June, 2020

Andrei Iancu
*Director of the United States Patent and Trademark Office*